United States Patent
Soeda

(10) Patent No.: US 11,054,460 B2
(45) Date of Patent: Jul. 6, 2021

(54) SOFT ERROR INSPECTION METHOD, SOFT ERROR INSPECTION APPARATUS, AND SOFT ERROR INSPECTION SYSTEM

(71) Applicant: FUJITSU LIMITED, Kawasaki (JP)

(72) Inventor: Takeshi Soeda, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 30 days.

(21) Appl. No.: 16/683,875

(22) Filed: Nov. 14, 2019

(65) Prior Publication Data
US 2020/0081056 A1  Mar. 12, 2020

Related U.S. Application Data

(63) Continuation of application No. PCT/JP2017/020863, filed on Jun. 5, 2017.

(51) Int. Cl.
*G01R 31/265* (2006.01)
*G01R 31/307* (2006.01)

(52) U.S. Cl.
CPC ....... *G01R 31/2653* (2013.01); *G01R 31/307* (2013.01)

(58) Field of Classification Search
None
See application file for complete search history.

(56) References Cited

U.S. PATENT DOCUMENTS

| | | | | |
|---|---|---|---|---|
| 7,135,676 B2* | 11/2006 | Nakasuji | ............... | G01N 23/225 250/310 |
| 2010/0001738 A1 | 1/2010 | Chang et al. | | |
| 2011/0099440 A1* | 4/2011 | Mims | ............... | G01R 31/31816 714/726 |
| 2012/0159269 A1 | 6/2012 | Ibe et al. | | |
| 2012/0284006 A1 | 11/2012 | Miller et al. | | |
| 2013/0061104 A1 | 3/2013 | Hartl | | |
| 2018/0129556 A1* | 5/2018 | Aoki | ................... | G06F 11/1004 |
| 2021/0096179 A1* | 4/2021 | De | ..................... | G01R 31/2653 |

FOREIGN PATENT DOCUMENTS

| | | | | |
|---|---|---|---|---|
| CN | 1183564 A | 6/1998 | | |
| JP | 1-248070 A | 10/1989 | | |
| JP | 2004-125633 A | 4/2004 | | |
| JP | 2011-504581 A | 2/2011 | | |
| JP | 2014-077654 A | 5/2014 | | |
| JP | 2014077654 A | * 5/2014 | ............. | G01R 31/28 |
| JP | 2014-134842 A | 7/2014 | | |

(Continued)

OTHER PUBLICATIONS

Schwank, James R. et al., "Estimation of Heavy-Ion LET Thresholds in Advnaced SOI IC Technologies From Two-Photon Absorption Laser Measurements," IEEE Transactions on Nuclear Science, vol. 57, No. 4, pp. 1827-1834, Aug. 2010.

(Continued)

*Primary Examiner* — Jermele M Hollington
(74) *Attorney, Agent, or Firm* — Fujitsu Patent Center

(57) ABSTRACT

A soft error inspection method for a semiconductor device includes: irradiating and scanning the semiconductor device with a laser beam or an electron beam; and measuring and storing a time of bit inversion for each of areas irradiated with the laser beam or the electron beam of the semiconductor device.

9 Claims, 9 Drawing Sheets

(56) References Cited

FOREIGN PATENT DOCUMENTS

| JP | 2017-40543 A | 2/2017 | |
|---|---|---|---|
| WO | 2011/007708 A1 | 1/2011 | |
| WO | WO-2019038836 A1 * | 2/2019 | ............. G01R 31/30 |

OTHER PUBLICATIONS

International Search Report and Written Opinion of the International Searching Authority, with Partial Translation (Form PCT/ISA/210, 220, and 237), mailed in connection with PCT/JP2017/020863 dated Aug. 29, 2017 (16 pages).
Ferlet-Cavrois, V. et al., "A New Technique for Set Pulse Width Measurement in Chains of Inverters Using Pulsed Laser Irradiation", Radiation and Its Efects on Components and Systems on, IEEE, Sep. 10, 2008, pp. 169-174, XP031877213.
Narasimham, Balaji et al., "Test Circuit for Measuring Pulse Widths of Single-Event Transients Causing Soft Errors", IEEE Transactions on Semiconductor Manufacturing, IEEE Service Center, Piscataway, NJ, US, vol. 22, No. 1, Feb. 1, 2009, pp. 119-125, XP011243322.
Extended European Search Report dated Apr. 24, 2020 for corresponding European Patent Application No. 17912622.2, 11 pages.
Japanese Office Action dated Jan. 5, 2021 for corresponding Japanese Patent Application No. 2019-523227, with English Translation, 8 pages. *Please note JP-2017-40543-A and JP-1-248070-A cited herewith, were previously cited in an IDS filed on Nov. 14, 2019.*.
Chinese Office Action dated Apr. 25, 2021 for corresponding Chinese Patent Application No. 201780091507.4, with English Translation, 25 pages.

* cited by examiner

SOFT ERROR INSPECTION METHOD, SOFT ERROR INSPECTION APPARATUS, AND SOFT ERROR INSPECTION SYSTEM

CROSS-REFERENCE TO RELATED APPLICATION

This application is a continuation application of International Application PCT/JP2017/020863 filed on Jun. 5, 2017 and designated the U.S., the entire contents of which are incorporated herein by reference.

FIELD

The embodiment relates to a soft error inspection method, a soft error inspection apparatus, and a soft error inspection system.

BACKGROUND

In semiconductor devices such as large scale integration (LSI), it is known that a so-called soft error occurs that is a malfunction due to radiation. Such a soft error has become a problem in not only mission-critical devices such as infrastructure servers and supercomputers, but also apparatuses that require radiation resistance such as for space use and medical use, and apparatuses that cannot be stopped for 24 hours such as factory automation (FA) devices and communication base station equipment.

Related art is disclosed in Japanese National Publication of International Patent Application No. 2011-504581 and Non-Patent Document 1: J. R. Schwank, and et al., IEEE Trans. Nucl. Sci., 57 (2010) 1827.

SUMMARY

According to an aspect of the embodiments, a soft error inspection method for a semiconductor device includes: irradiating and scanning the semiconductor device with a laser beam or an electron beam; and measuring and storing a time of bit inversion for each of areas irradiated with the laser beam or the electron beam of the semiconductor device.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
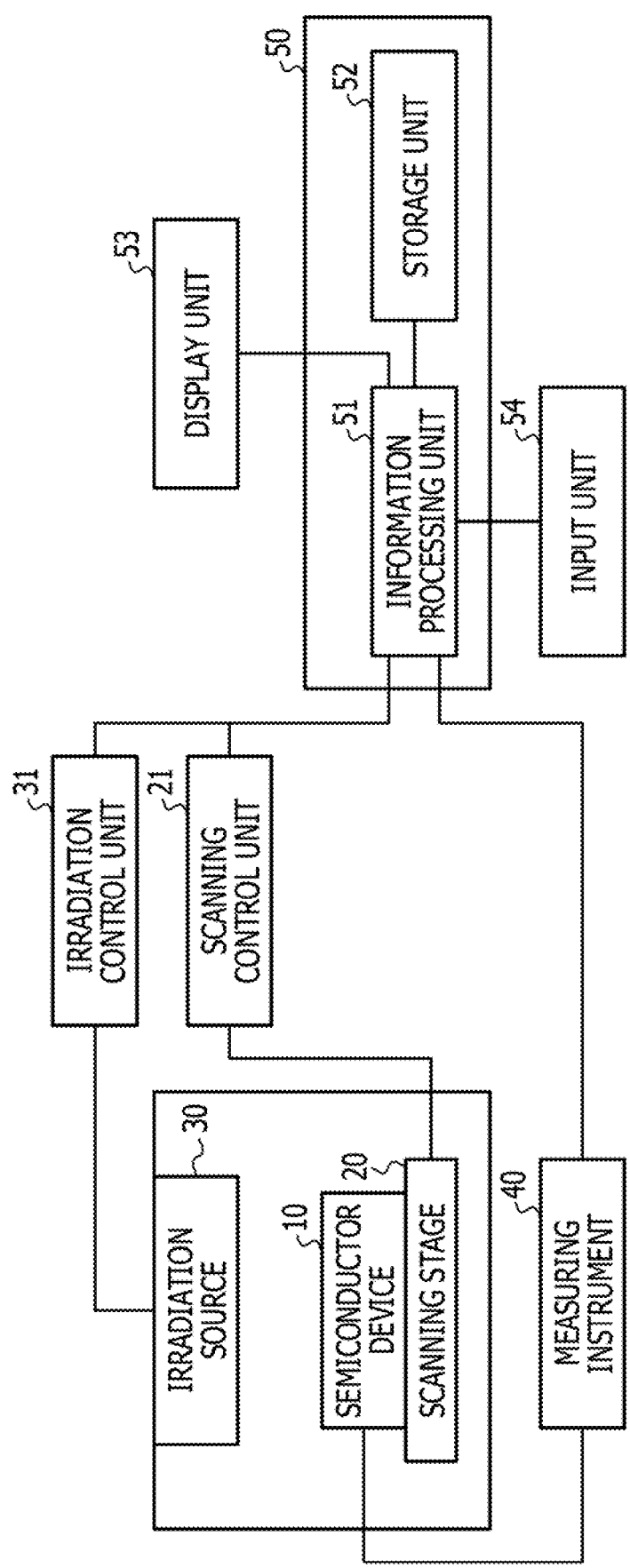
FIG. 1 is a structural diagram of a soft error inspection apparatus in a first embodiment.

No defect remains of the soft error, so that inspection is difficult. For example, as a soft error inspection method, there are a running test in a high altitude, a test using an accelerator, and the like. The test using the accelerator can be further divided into a method of radiating neutrons or ions to the entire surface of an LSI chip, and a method of locally radiating focusable electrons or lasers. Among these methods, a laser evaluation method can be implemented with small-scale equipment because it does not need to make a vacuum, and is superior in that a specific memory area can be individually evaluated.

However, in the laser evaluation method, only an inverted position can be known of a memory that is inverted by radiation of a laser beam, but durability (endurance period) regarding the soft error cannot be known.

There is therefore a need for a soft error inspection method capable of locally evaluating influence of radiation received by the semiconductor device, particularly the durability, and knowing an endurance time or the like regarding the soft error of the semiconductor device.

Hereinafter, embodiments will be described. Note that, the same members and the like are denoted by the same reference numerals and repeated description will be omitted.

First Embodiment

First, an outline will be described of a soft error and a soft error inspection method. When a high energy beam is incident on the inside of an LSI chip, it continues to travel while losing energy, and an electron-hole pair is generated along its track. When these charges move to an electrode and flow into a storage node and become charges greater than or equal to a threshold value, bit information recorded until then is inverted (from 0 to 1, or from 1 to 0). This phenomenon is called single event upset (SEU) and is the largest malfunction factor of a memory in the LSI chip.

As described later, in the present embodiment, an energy beam is used to perform accelerated evaluation of the SEU, but generation mechanisms of the SEU are different from each other between a laser and charged particles such as an electron beam. In the case of the charged particles such as the electron beam, an electron-hole pair is generated by the ionization effect by irradiating the LSI chip with the charged particles such as the electron beam. On the other hand, in the case of the laser, when the LSI chip is irradiated with the laser beam, an electron-hole pair is generated by an excitation process in which two photons are simultaneously absorbed, which is referred to as two-photon absorption. Specifically, when energy by the photon exceeds 1.12 eV that is the band gap energy of Si, the electron-hole pair is generated by indirect transition. As described above, generation mechanisms of the electron-hole pair are different from each other between the laser and the charged particles such as the electron beam, but processes of inducing the subsequent SEU are the same as each other.

A soft error due to radiation of charged particles including electrons can be quantitatively evaluated by linear energy transfer (LET) (an index that represents quality of radiation by the amount of energy given per unit length). On the other hand, an energy threshold value P.E at which a soft error occurs due to two-photon absorption by the laser is expressed by an equation indicated in Equation 1 below, by using the LET.

$$(P.E)^2 = 0.95 \times LET \quad \text{[Equation 1]}$$

Since irradiation by charged particle radiation and laser irradiation by two-photon absorption have a relationship of the equation indicated in Equation 1, for convenience, in the following description, description will be made as the LET.

There are various parameters as parameters of an irradiation condition of the laser and the charged particles such as the electron beam, and examples thereof include energy, power, dosage rate, dose, frequency, pulse width, duty ratio, and the like. When these parameters of the irradiation condition are changed, the LET given to a material changes as a result. Regarding the irradiation condition, not only a total amount of energy given is a problem, but for example, a recovery phenomenon due to re-inversion phenomenon often occurs when bit inversion measurement is actually performed, and such a recovery phenomenon largely depends on the pulse width, the duty ratio, or the like. For that reason, recording bit information of the memory under various irradiation conditions is important for durability evaluation. Note that, as the irradiation condition, for example, the energy density of the laser is 0.02 J/cm$^2$, the center wavelength is 1560 nm, the power is 340 mW, the frequency is 80 MHz, or the like.

In the case of the laser irradiation, a laser focused to several micrometers by use of a laser optical system is radiated to an LSI chip that is a semiconductor device to be a sample. In addition, in the case of the electron beam irradiation, a scanning electron microscope (SEM) may be used. In either case, the laser or the charged particles such as the electron beam are radiated under a specific irradiation condition, at a certain coordinate position of the LSI chip, and a temporal change in the bit information of the memory of the LSI is recorded during the irradiation. After irradiation for a sufficient time in consideration of re-inversion and the like, a position is moved of the energy beam or the LSI chip that is the semiconductor device to be the sample, and similar processing is repeated.

An acceleration factor of the laser irradiation or the electron beam irradiation to atmospheric radiation may be calculated under each irradiation condition by using a memory to be a standard sample in advance. A value of the acceleration factor can be calculated by collating error occurrence frequency. A durability (endurance time) map according to energy beam irradiation can be calculated by a product of an irradiation time taken for bit inversion and the acceleration factor. When the endurance time map is converted into an amount per unit time, it becomes an error occurrence frequency map.

When these maps are obtained, a memory operation method may then be adjusted not to cause a trouble as a semiconductor device. Although various cases are assumed for the operation method, for example, it may be determined whether or not the LSI chip being evaluated satisfies a specification of the error occurrence frequency. At this time, an error occurrence frequency area that does not satisfy the specification may be visualized by coloring or the like. In addition, the number of areas that do not satisfy the specification existing in the LSI chip may be counted to determine a durability grade of the LSI chip.

In addition, memory allocation may be optimized depending on a use environment and the like. When radiation is incident on the material, charges are generated around an incident position, so that it is considered that a memory near the incident position is likely to be inverted. For this reason, in the case of overall averaging, combinations may be adjusted such that positions (addresses) with low durability are not allocated together. In addition, adjustment may be made by combining only high durability addresses without using low durability addresses.

(Soft Error Inspection Apparatus and Soft Error Inspection System)

Next, a soft error inspection apparatus in the first embodiment will be described. FIG. 1 illustrates the soft error inspection apparatus and a soft error inspection system in the present embodiment. The soft error inspection apparatus in the present embodiment includes a scanning stage 20, an irradiation source 30, a scanning control unit 21, an irradiation control unit 31, a measuring instrument 40, a control unit 50, and the like. The control unit 50 includes an information processing unit 51, a storage unit 52, a display unit 53, an input unit 54, and the like.

The semiconductor device 10 that is a sample to be inspected is an LSI chip or the like, and such a semiconductor device 10 is set on the scanning stage 20 and can be moved two-dimensionally, for example, in the X axis direction and the Y axis direction, by the scanning stage 20. The scanning stage 20 is controlled by the scanning control unit 21.

The irradiation source 30 emits a laser beam radiated to the semiconductor device 10, and is controlled by the irradiation control unit 31. In the present embodiment, a case will be described where the laser beam is emitted from the irradiation source 30; however, the charged particles such as the electron beam may be emitted. In a case where the semiconductor device 10 is a semiconductor device formed of silicon, since a wavelength range in which two-photon absorption occurs in silicon is 1100 nm to 2100 nm, a wavelength of the laser emitted from the irradiation source 30 is, for example, about 1500 nm.

The measuring instrument 40 is a tester or the like, and is coupled to the terminal of the semiconductor device 10, and can measure a change in information stored in the semiconductor device 10.

The control unit 50 performs control of the entire soft error inspection apparatus and information processing operation regarding the soft error inspection method in the present embodiment. The information processing unit 51 is connected to the storage unit 52 that stores information, the display unit 53 for displaying necessary information, and the input unit 54 for inputting information to the information processing unit 51, and the like. In the present embodiment, the soft error inspection system is enabled to execute the soft error inspection method described below by the control in the control unit 50.

(Soft Error Inspection Method)

Figure 2:
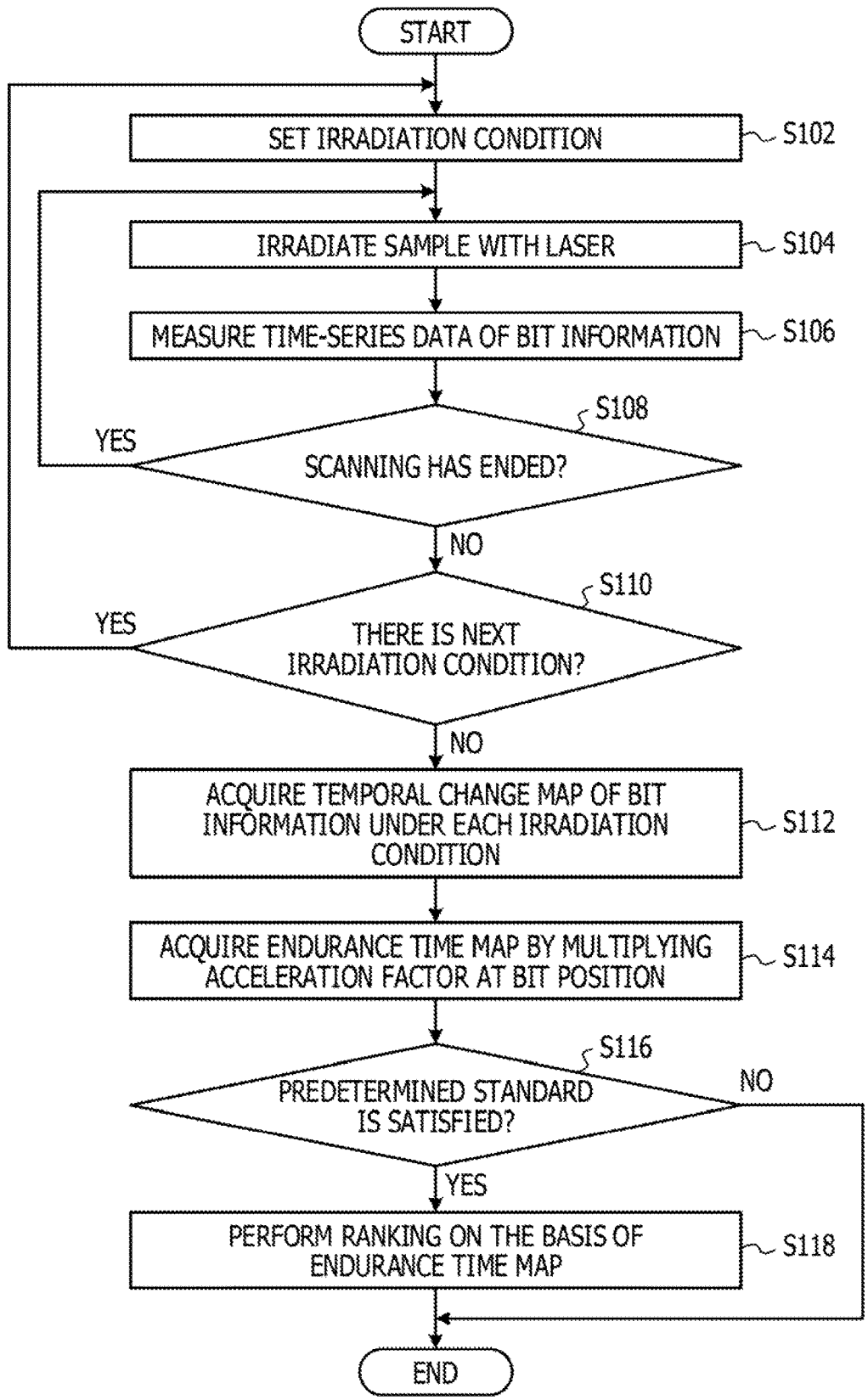
FIG. 2 is a flowchart of a soft error inspection method in the first embodiment.

Next, the soft error inspection method in the present embodiment will be described with reference to FIG. 2. The semiconductor device 10 to be inspected in the soft error inspection method in the present embodiment is a static random access memory (SRAM), a flash memory, a field-programmable gate array (FPGA), an application specific integrated circuit (ASIC), or the like.

First, in step 102 (S102), an irradiation condition of the laser to be irradiated is set. For example, one or more irradiation conditions are selected in advance in consideration of parameters such as the LET, energy, dosage rate, dosage, pulse width, frequency, and duty ratio, and one of the selected irradiation conditions is set as the irradiation condition. Here, the energy is energy of the laser. The dosage rate is also called flux, and is the number of photons per unit time and unit area. The dosage is also called a dose, and is the number of photons per unit area. The pulse width, frequency, and duty ratio respectively mean a pulse width of a laser pulse to be radiated, a frequency of the pulse, and a duty ratio of the pulse.

Figure 3:
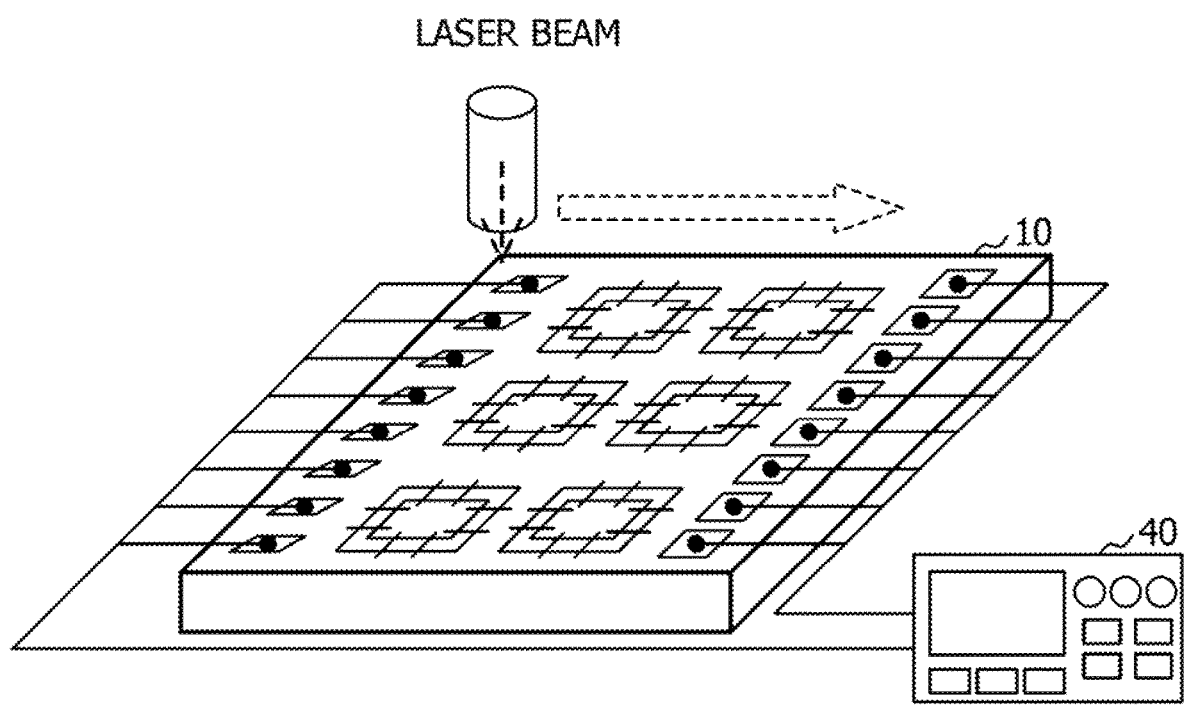
FIG. 3 is an explanatory diagram (1) of the soft error inspection method in the first embodiment.

Next, in step 104 (S104), the semiconductor device 10 to be a sample is irradiated with the laser beam for a predetermined time under the set irradiation condition. For example, as illustrated in FIG. 3, the laser beam is radiated to a predetermined position of the semiconductor device 10 for the predetermined time under the set condition.

Figure 4A:
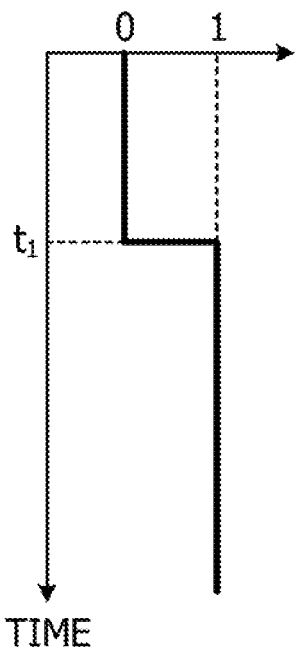
FIGS. 4A to 4C are an explanatory diagram (2) of the soft error inspection method in the first embodiment.
Figure 4B:
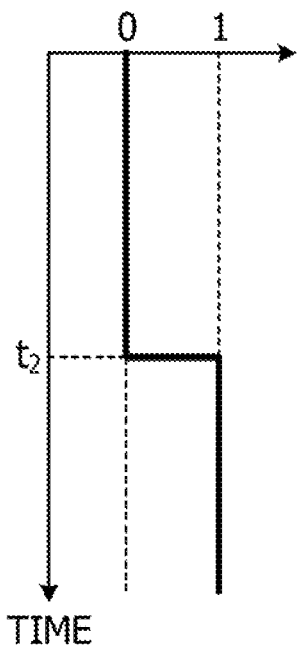
Figure 4C:
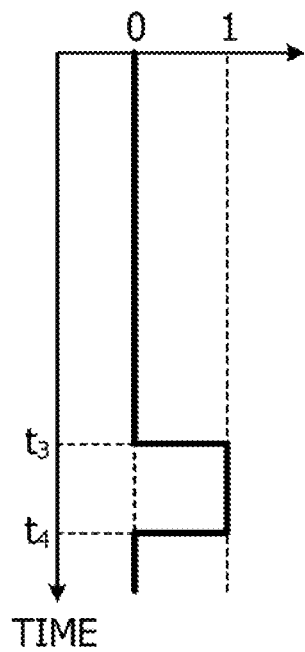

Next, in step 106 (S106), time-series data of bit information of a position irradiated with the laser beam is measured, and stored in the storage unit 52 or the like. For example, as illustrated in FIG. 3, the time-series data of the bit information of the position irradiated with the laser beam, for example, a temporal change of the bit information is measured and stored in the storage unit 52 or the like, by the measuring instrument 40 such as the tester, in a state where the laser beam is radiated. FIGS. 4A to 4C illustrate the time-series data of the bit information of the position irradiated with the laser beam detected by the measuring instrument 40. FIG. 4A illustrates a state where the bit information is inverted from 0 to 1 when time $t_1$ has elapsed from the laser beam irradiation start. FIG. 46 illustrates a state where the bit information is inverted from 0 to 1 when time $t_2$ has elapsed from the laser beam irradiation start. FIG. 4C illustrates a state where the bit information is inverted from 0 to 1 when time $t_3$ has elapsed from the laser beam irradiation start, and further, the bit information is re-inverted from 1 to 0 when time $t_4$ has elapsed.

Next, in step 108 (S108), it is determined whether or not scanning by the laser beam has ended. For example, in the soft error inspection method in the present embodiment, since the inspection is performed by scanning a predetermined area of the semiconductor device 10, it is determined whether or not the scanning by the laser beam has ended in the semiconductor device 10, that is, whether or not the inspection of the predetermined area has ended. In a case where the scanning by the laser beam has ended, the processing proceeds to step 110, and in a case were the scanning by the laser beam has not ended, an irradiation position of the laser beam is moved, and the processing proceeds to step 104 and steps 104 and 106 are repeated.

Next, in step 110 (S110), it is determined whether or not there is a next irradiation condition. For example, it is determined whether or not there is a measurement condition that has not been performed under the set irradiation conditions although one or a plurality of irradiation conditions is set in step 102. In a case where there is the next irradiation condition, the processing proceeds to step 102, and the next irradiation condition is set and steps 104 and 106 are repeated. In a case where there is no irradiation condition next, the processing proceeds to step 112.

Figure 5:
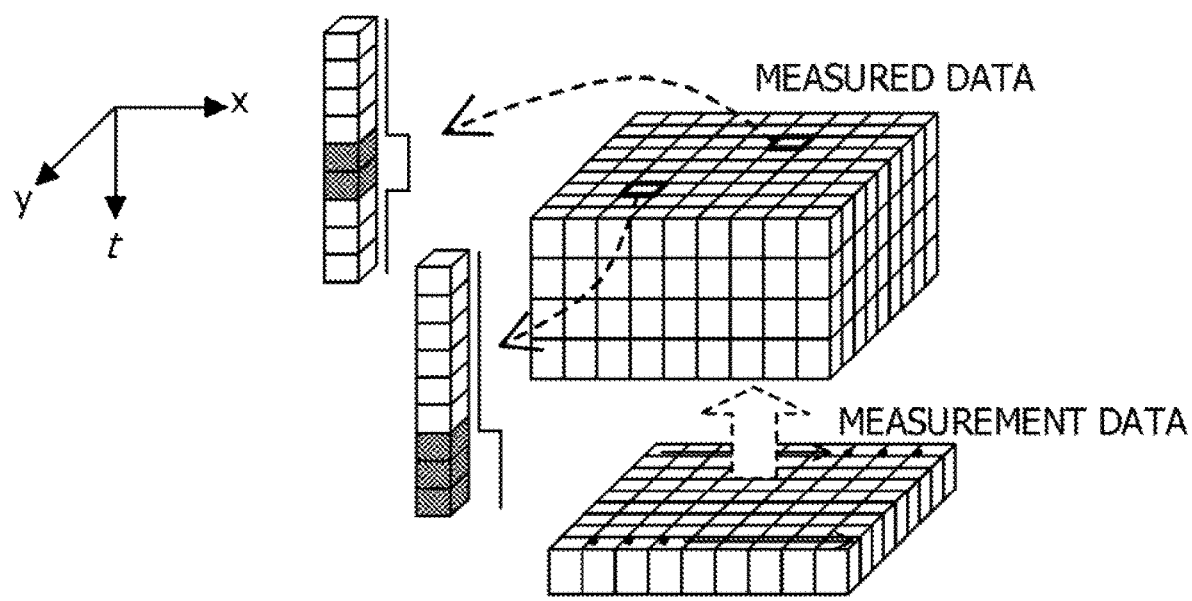
FIG. 5 is an explanatory diagram (3) of the soft error inspection method in the first embodiment.

Next, in step 112 (S112), on the basis of an obtained result, a temporal change map is created of the bit information of the semiconductor device 10 under each irradiation condition. For example, as illustrated in FIG. 5, the temporal change map of the bit information in three dimensions x, y, and t is created for each irradiation condition.

Figure 6:
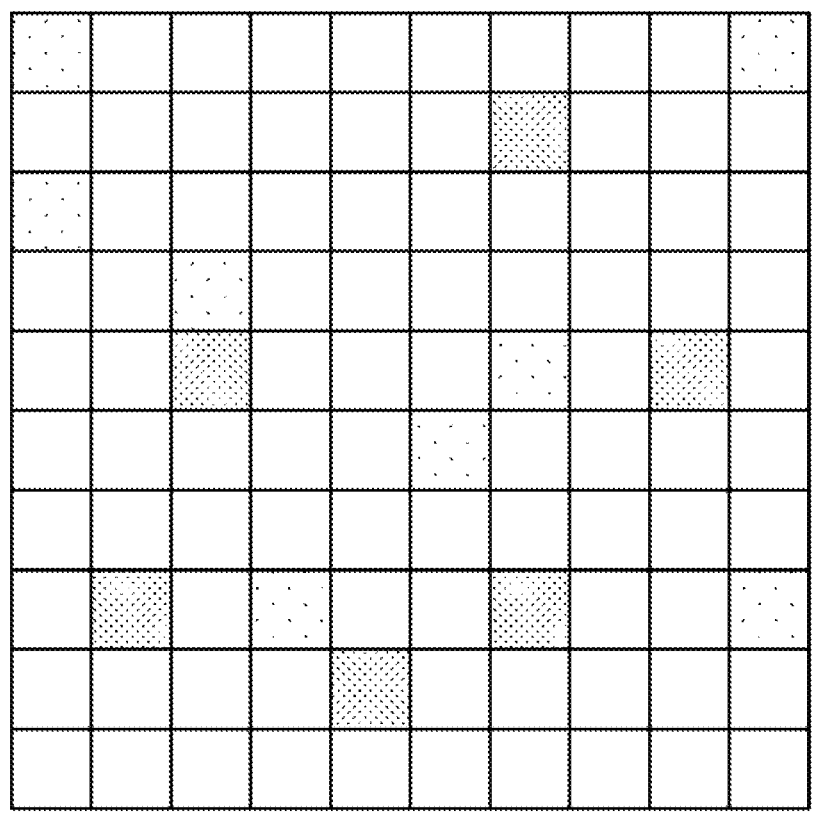
FIG. 6 is an explanatory diagram (4) of the soft error inspection method in the first embodiment.

Next, in step 114 (S114), an endurance time map is created. For example, as illustrated in FIG. 5, an endurance time at each bit position is calculated by multiplication of a time required for inversion at each bit position by a predetermined acceleration factor, and the endurance time is two-dimensionalized, whereby the endurance time map is obtained as illustrated in FIG. 6.

Next, in step 116 (S116), on the basis of the endurance time map obtained in step 114, it is determined whether or not the semiconductor device 10 to be inspected satisfies a predetermined standard. For example, it is determined whether or not a ratio of an area with an endurance time of greater than or equal to five years is greater than or equal to 90%. In a case where the predetermined standard is satisfied, the processing proceeds to step 118, and in a case where the predetermined standard is not satisfied, an alert is issued and the semiconductor device 10 is treated as a defective product, and then the processing ends.

Next, in step 118 (S118), on the basis of the endurance time map, ranking is performed of the semiconductor device 10 inspected. For example, the ranking is performed such that, regarding a ratio of the area with the endurance time of greater than or equal to five years, in a case where the ratio is greater than or equal to 97%, the device is ranked as rank A, in a case where the ratio is less than 97% and greater than or equal to 94%, the device is ranked as rank B, and in a case where the ratio is less than 94% and greater than or equal to 90%, the device is ranked as rank C, and then the processing ends.

Thus, the soft error inspection method in the present embodiment ends.

According to the soft error inspection method in the present embodiment, the endurance time can be known regarding the soft error for each area of the semiconductor device, and quality determination or the like of the semiconductor device can be performed on the basis of the endurance time obtained.

Second Embodiment

Figure 7:
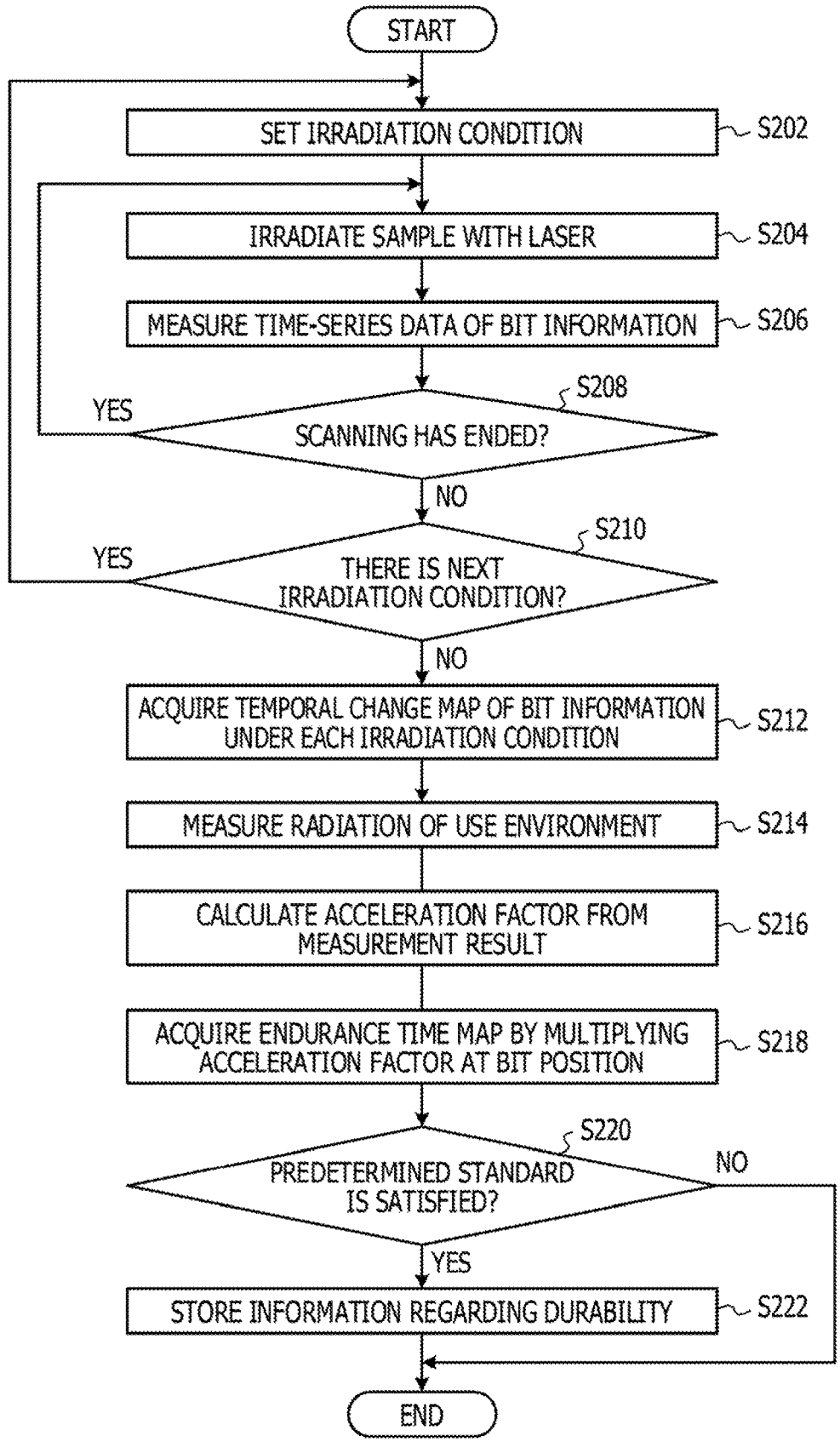
FIG. 7 is a flowchart of a soft error inspection method in a second embodiment.

Next, a soft error inspection method in a second embodiment will be described with reference to FIG. 7. The soft error inspection method in the present embodiment is performed by using the soft error inspection apparatus in the first embodiment.

First, in step 202 (S202), an irradiation condition of the laser to be irradiated is set. Specifically, one or more irradiation conditions are selected in advance in consideration of the LET, energy, dosage rate, dosage, pulse width, frequency, duty ratio, and the like, and one of the selected irradiation conditions is set as the irradiation condition.

Next, in step 204 (S204), the semiconductor device 10 to be a sample is irradiated with the laser beam for a predetermined time under the set irradiation condition.

Next, in step 206 (S206), time-series data of bit information of a position irradiated with the laser beam is measured, and stored in the storage unit 52 or the like.

Next, in step 208 (S208), it is determined whether or not scanning by the laser beam has ended. In a case where the scanning by the laser beam has ended, the processing proceeds to step 210, and in a case were the scanning by the laser beam has not ended, an irradiation position of the laser beam is moved, and the processing proceeds to step 204 and steps 204 and 206 are repeated.

Next, in step 210 (S210), it is determined whether or not there is a next irradiation condition. In a case where there is the next irradiation condition, the processing proceeds to step 202, and the next irradiation condition is set and steps 204 and 206 are repeated. In a case where there is no irradiation condition next, the processing proceeds to step 212.

Next, in step 212 (S212), on the basis of an obtained result, a temporal change map is created of the bit information of the semiconductor device 10 under each irradiation condition.

Next, in step 214 (S214), radiation measurement is performed of an environment in which the semiconductor device 10 is used.

Next, in step 216 (S216), an acceleration factor is calculated by comparing an amount of radiation of the environment in which the semiconductor device 10 is used obtained in step 214 is compared with the LET. For example, in a case where one second of laser irradiation time corresponds to one year ($3.2 \times 10^7$ seconds) of radiation in the environment in which the semiconductor device is used, the acceleration factor is $3.2 \times 10^7$.

Next, in step 218 (S218), an endurance time map is created by using the acceleration factor obtained in step 216. Specifically, an endurance time at each bit position is calculated by multiplication of a time required for inversion at each bit position by the acceleration factor obtained in step 216, and the endurance time is two-dimensionalized, whereby the endurance time map is obtained.

Next, in step 220 (S220), on the basis of the endurance time map obtained in step 218, it is determined whether or not the semiconductor device 10 that is a sample to be inspected satisfies a predetermined standard. In a case where the predetermined standard is satisfied, the processing proceeds to step 222, and in a case where the predetermined standard is not satisfied, the semiconductor device 10 becomes a defective product, and then the processing ends.

Figure 8:
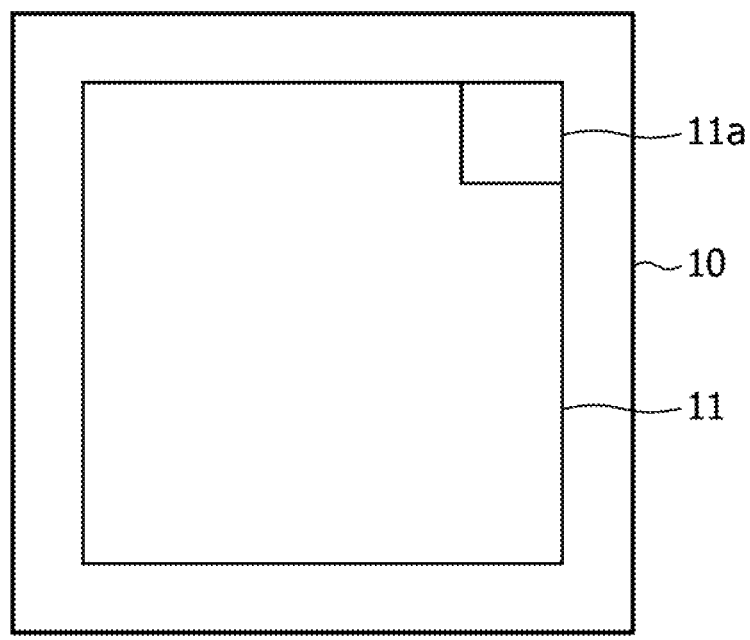
FIG. 8 is an explanatory diagram of a semiconductor device obtained in the second embodiment.

Next, in step 222 (S222), obtained information regarding durability is stored in the semiconductor device. Specifically, as illustrated in FIG. 8, information regarding the endurance time map may be stored in a partial area 11a of a memory area 11 of the semiconductor device 10. On the basis of the information stored in this manner, memory allocation can be optimized in the semiconductor device 10 when the semiconductor device 10 is used. In addition, in the semiconductor device 10, position information of a low tolerance area having a short endurance time or position information of a high tolerance area having a long endurance time may be stored in the partial area 11a of the memory area 11 of the semiconductor device 10. In a case where the semiconductor device 10 is an SRAM type FPGA or the like, the position information of the low tolerance area, the high tolerance area, or the like may be stored outside the FPGA, that is, in a semiconductor device such as a flash memory or EEPROM that is an external storage medium.

Figure 9:
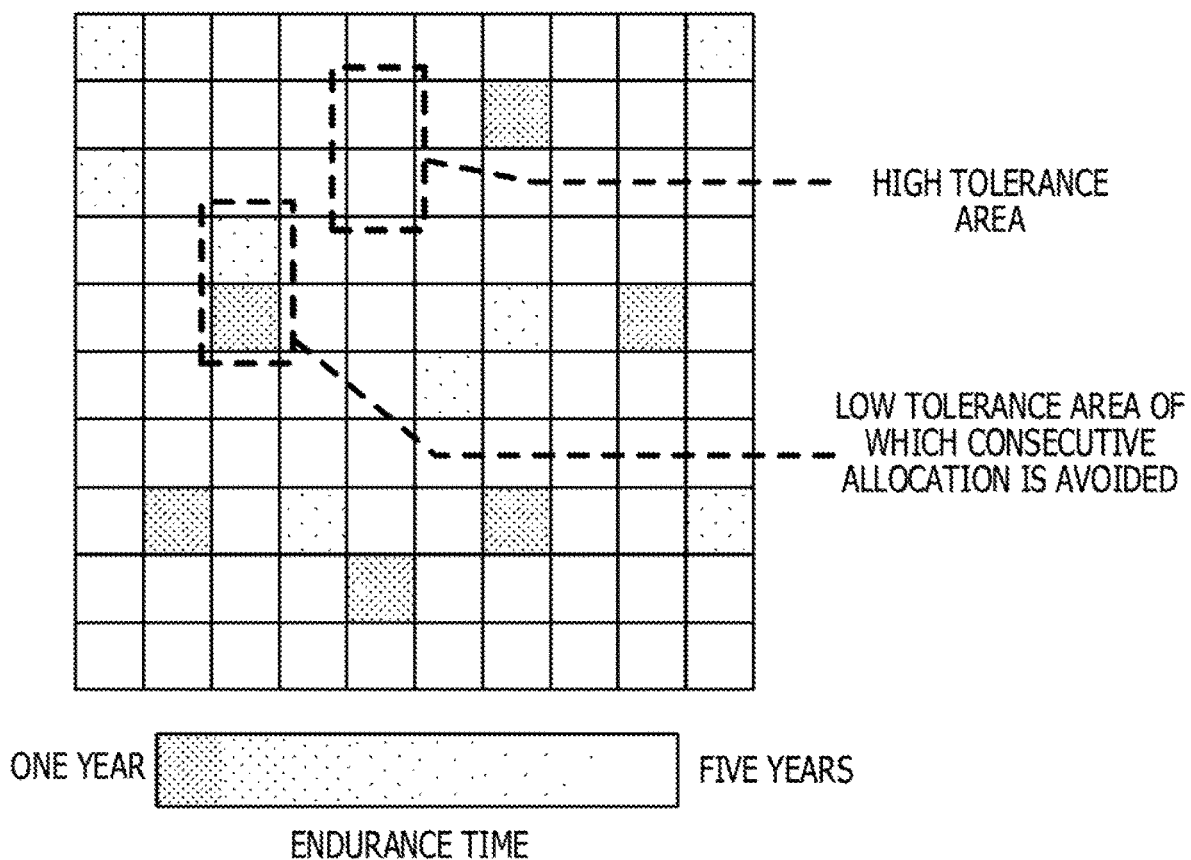
FIG. 9 is an explanatory diagram of the soft error inspection method in the second embodiment.

In the semiconductor device 10, an area to be used may be set on the basis of the bit inversion time obtained above. In addition, the area to be used may be set corresponding to an elapsed time having been used and a purpose of use. Specifically, as illustrated in FIG. 9, in a case where important processing is performed, bits of the high tolerance area having the long endurance time may be preferentially used, and the low tolerance areas may not be allocated consecutively. In addition, in a case where the semiconductor device is already in use and a long period has elapsed, an allocated combination may be canceled and a combination may be made to prolong the endurance time. Moreover, an area having a short endurance time may be avoided in use. Such allocation may be performed by a person using an apparatus on which the semiconductor device 10 is mounted, and a function of performing such allocation may be incorporated in the apparatus on which the semiconductor device 10 is mounted.

Thus, the soft error inspection method in the present embodiment ends. According to the soft error inspection method in the present embodiment, the semiconductor device can be operated in consideration of the soft error, and highly reliable information processing can be performed.

Note that, contents other than the above are similar to those in the first embodiment.

In the above, the embodiments have been described in detail; however, the present invention is not limited to a specific embodiment, and various modifications and changes are possible within the scope described in claims.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A soft error inspection method for a semiconductor device, comprising:
    irradiating and scanning the semiconductor device with a laser beam or an electron beam;
    measuring and storing a time of bit inversion for each of areas irradiated with the laser beam or the electron beam of the semiconductor device; and
    calculating an endurance time by multiplying the time of bit inversion stored, by a predetermined acceleration factor.

2. The soft error inspection method according to claim 1, wherein the predetermined acceleration factor is obtained from a relationship between an amount of radiation of an environment in which the semiconductor device is used and the laser beam or the electron beam radiated to the semiconductor device.

3. The soft error inspection method according to claim 1, wherein an area to be used in the semiconductor device is set on a basis of information on the time of bit inversion measured.

4. The soft error inspection method according to claim 3, wherein the area to be used is set corresponding to an elapsed time or a purpose of use.

5. The soft error inspection method according to claim 3, wherein information regarding the area to be used or the time of bit inversion is stored in the semiconductor device or a different semiconductor device from the semiconductor device.

6. The soft error inspection method according to claim 1, wherein quality of the semiconductor device is determined on a basis of information on the time of bit inversion measured.

7. The soft error inspection method according to claim 1, wherein the semiconductor device is two-dimensionally scanned and irradiated with the laser beam or the electron beam, and information on the time of bit inversion in each of the areas irradiated is measured and stored.

8. A soft error inspection apparatus comprising:

a stage on which a semiconductor device is set;

an irradiation source configured to emit a laser beam or an electron beam radiated to the semiconductor device;

a measuring device coupled to the semiconductor device and configured to measure bit inversion in areas irradiated with the laser beam or the electron beam;

a processor configured to:

store a time of bit inversion, for each of the areas irradiated with the laser beam or the electron beam, of the semiconductor device measured by the measuring device in a memory; and calculate an endurance time by multiplying the time of bit inversion stored, by a predetermined acceleration factor.

9. A soft error inspection system comprising:

a soft error inspection apparatus;

a display device coupled the soft error inspection apparatus; and an input device coupled the soft error inspection apparatus, the soft error inspection apparatus includes:

a stage on which a semiconductor device is set; an irradiation source configured to emit a laser beam or an electron beam radiated to the semiconductor device;

a measuring device coupled to the semiconductor device and configured to measure bit inversion in areas irradiated with the laser beam or the electron beam; and a processor configured to:

store a time of bit inversion, for each of the areas irradiated with the laser beam or the electron beam, of the semiconductor device measured by the measuring device in a memory; and calculate an endurance time by multiplying the time of bit inversion stored, by a predetermined acceleration factor.

* * * * *